(12) United States Patent
Villarroel et al.

(10) Patent No.: US 7,880,670 B2
(45) Date of Patent: Feb. 1, 2011

(54) SIGNAL MEASUREMENT SYSTEM AND METHOD FOR TESTING AN RF COMPONENT

(75) Inventors: Wladimiro Villarroel, Ypsilanti, MI (US); Argy Petros, Parkland, FL (US)

(73) Assignee: AGC Automotive, Ypsilanti, MI (US)

( * ) Notice: Subject to any disclaimer, the term of this patent is extended or adjusted under 35 U.S.C. 154(b) by 414 days.

(21) Appl. No.: 12/139,616

(22) Filed: Jun. 16, 2008

(65) Prior Publication Data

US 2008/0309565 A1   Dec. 18, 2008

Related U.S. Application Data

(60) Provisional application No. 60/944,553, filed on Jun. 18, 2007.

(51) Int. Cl.
*G01S 7/40* (2006.01)
*H04B 17/00* (2006.01)

(52) U.S. Cl. .................... 342/165; 342/173; 455/67.11; 455/67.12; 455/67.13; 455/67.14

(58) Field of Classification Search ..................... 342/1, 342/70–72, 165, 169–174; 455/67.11, 67.12, 455/67.13, 67.14
See application file for complete search history.

(56) References Cited

U.S. PATENT DOCUMENTS

| | | | | |
|---|---|---|---|---|
| 4,621,265 A | * | 11/1986 | Buse et al. | 342/169 |
| 4,800,387 A | * | 1/1989 | Joy | 342/165 |
| 4,864,315 A | | 9/1989 | Mohuchy | |
| 4,884,078 A | | 11/1989 | Fishkin et al. | |
| 4,901,080 A | * | 2/1990 | McHenry | 342/1 |
| 5,001,494 A | | 3/1991 | Dorman et al. | |
| 5,134,405 A | * | 7/1992 | Ishihara et al. | 342/1 |
| 5,270,723 A | | 12/1993 | Lopez et al. | |
| 5,396,255 A | * | 3/1995 | Durkota et al. | 342/360 |
| 5,410,319 A | | 4/1995 | Lopez et al. | |
| 5,432,523 A | | 7/1995 | Simmers et al. | |
| 5,485,158 A | * | 1/1996 | Mailloux et al. | 342/165 |
| 5,670,965 A | | 9/1997 | Tuovinen et al. | |
| 5,825,331 A | * | 10/1998 | Lee | 343/703 |

(Continued)

FOREIGN PATENT DOCUMENTS

CA   2578310 A1   5/2007

OTHER PUBLICATIONS

PCT International Search Report for PCT/US2008/007541 dated Feb. 18, 2009, 3 pages.

(Continued)

*Primary Examiner*—Thomas H Tarcza
*Assistant Examiner*—Peter Bythrow
(74) *Attorney, Agent, or Firm*—Howard & Howard Attorneys PLLC

(57) ABSTRACT

A signal measurement system tests an RF component in an RF test facility, such as an RF anechoic chamber. The system includes a repeater which is connected to an exterior antenna disposed outside the chamber and a transmitting antenna disposed inside the chamber. The repeater receives the RF broadcast signal from the exterior antenna and rebroadcasts it as an RF testing signal inside the chamber. The subject antenna receives the RF testing signal, which is then analyzed with a computer. The repeater may also modify the RF testing signal to produce a wide variety of test situations that mimic those available in a traditional field-test.

26 Claims, 3 Drawing Sheets

U.S. PATENT DOCUMENTS

| | | | |
|---|---|---|---|
| 5,893,031 A * | 4/1999 | Hoogerwerf et al. | 455/410 |
| 6,114,985 A * | 9/2000 | Russell et al. | 342/169 |
| 6,137,992 A * | 10/2000 | Mohan et al. | 455/67.12 |
| 6,236,362 B1 * | 5/2001 | Walley et al. | 342/360 |
| 6,313,799 B1 | 11/2001 | Thimm et al. | |
| 6,329,953 B1 * | 12/2001 | McKivergan | 343/703 |
| 6,421,004 B2 * | 7/2002 | Walley et al. | 342/360 |
| 6,556,023 B2 | 4/2003 | Okazaki | |
| 6,657,214 B1 | 12/2003 | Foegelle et al. | |
| 6,771,698 B1 * | 8/2004 | Beck | 375/224 |
| 6,850,851 B1 | 2/2005 | Fourestie et al. | |
| 6,947,702 B2 | 9/2005 | Green, Sr. et al. | |
| 7,102,562 B2 * | 9/2006 | Moller et al. | 342/4 |
| 7,154,435 B2 * | 12/2006 | Morgan et al. | 342/165 |
| 7,170,457 B2 * | 1/2007 | Tsai et al. | 343/703 |
| 7,190,301 B2 * | 3/2007 | Krenz et al. | 342/1 |
| 7,228,105 B2 * | 6/2007 | Rowell et al. | 455/67.11 |
| 7,474,905 B2 * | 1/2009 | Yamaguchi et al. | 455/562.1 |
| 7,489,905 B2 * | 2/2009 | Qi et al. | 455/67.11 |
| 7,498,977 B2 * | 3/2009 | Wei et al. | 342/165 |
| 7,505,766 B2 * | 3/2009 | Qi et al. | 455/425 |
| 7,555,294 B2 * | 6/2009 | Qi et al. | 455/425 |

OTHER PUBLICATIONS

Bodnar, Dr. Donald G, "Testing Telematic Antennas," MPD Microwave Product Digest, May 2002.

* cited by examiner

SIGNAL MEASUREMENT SYSTEM AND METHOD FOR TESTING AN RF COMPONENT

CROSS REFERENCE TO RELATED APPLICATION

This application claims the benefit of U.S. Provisional Application No. 60/944,553, filed Jun. 18, 2007, which is hereby incorporated by reference.

BACKGROUND OF THE INVENTION

1. Field of the Invention

The subject invention generally relates to a signal measurement system and method for testing an RF component. More specifically, the subject invention relates to a signal measurement system and method utilizing an RF anechoic chamber.

2. Description of the Related Art

Testing of RF components, such as antennas, receivers, amplifiers, etc., is critical to verify their actual performance either independently or when integrated into a system. Typically, testing of such RF components is performed utilizing RF anechoic chambers and/or field tests in less controlled conditions. These field tests often lead to inaccurate, unreliable, unrepeatable, and inefficient results, since they are subject to several uncontrollable factors. These factors include, but are not limited to, environmental conditions, roadway traffic, signal interference, the geographical location(s) of the test, and vegetation and building obstructions. These factors are especially significant, and can even be compounded when testing vehicle-mounted antennas. Furthermore, small errors made during these field tests may void an entire set of test data, leading to unnecessary repetition of the test. Moreover, field tests of antennas, especially vehicle mounted antennas, can be extremely costly, both in terms of monetary expenditures for manpower as well as fuel.

Conversely, typical testing in an RF test facility, e.g., an RF anechoic chamber, lacks many of the "real world" factors necessary for accurate testing of RF components. One such factor is the inherent unpredictability of an actual RF broadcast signal. Typical testing relies on a signal generator to produce an RF testing signal with a predetermined and almost perfect waveform. Another factor lacking in a typical RF test facility are the variations of RF broadcast signals due to propagation that occur between an RF broadcast antenna and the RF component in a field test.

Therefore, there is a need for a system that provides the "real-world" conditions of field tests combined with the controlled, repeatable conditions of anechoic chamber tests.

SUMMARY OF THE INVENTION AND ADVANTAGES

The subject invention provides a signal measurement system for testing at least one RF component. The system includes an enclosed RF testing facility and an exterior antenna disposed outside the facility for receiving an RF broadcast signal. A repeater, acting as a signal source, is in communication with the exterior antenna for receiving the RF broadcast signal from the exterior antenna and generating an RF testing signal. A transmitting antenna is disposed inside the facility and in communication with the repeater for transmitting the RF testing signal such that the RF testing signal may be received by the RF component.

The subject invention also provides a method of testing the at least one RF component disposed in the RF testing facility. The method includes the step of receiving the RF broadcast signal with the exterior antenna disposed outside the facility. The method also includes the step of generating the RF testing signal generally corresponding to the RF broadcast signal. The RF testing signal is transmitted with the transmitting antenna which is disposed inside the facility. The RF testing signal is then received with the RF component. The method further includes the step of analyzing the RF testing signal received by the RF component.

The subject invention provides numerous advantages over the prior art. For instance, the subject invention allows for the introduction of "real world" factors into a controlled and repeatable environment. As such, an actual RF broadcast signal, which has been affected by propagation conditions, e.g., fading and/or obstructions, can be used to test the RF component(s). Furthermore, the financial and environmental costs for testing the RF component, especially a subject antenna mounted to a vehicle, are greatly reduced, since there is no need for long distance driving of the vehicle. Moreover, the subject invention reduces the development cycle of RF components, as a component may be subjected to testing almost immediately, without the burden of logistical scheduling, time of day, geographic location, or weather conditions of a particular season (e.g., snow in winter or vegetation in summer).

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION OF THE INVENTION

Figure 1:
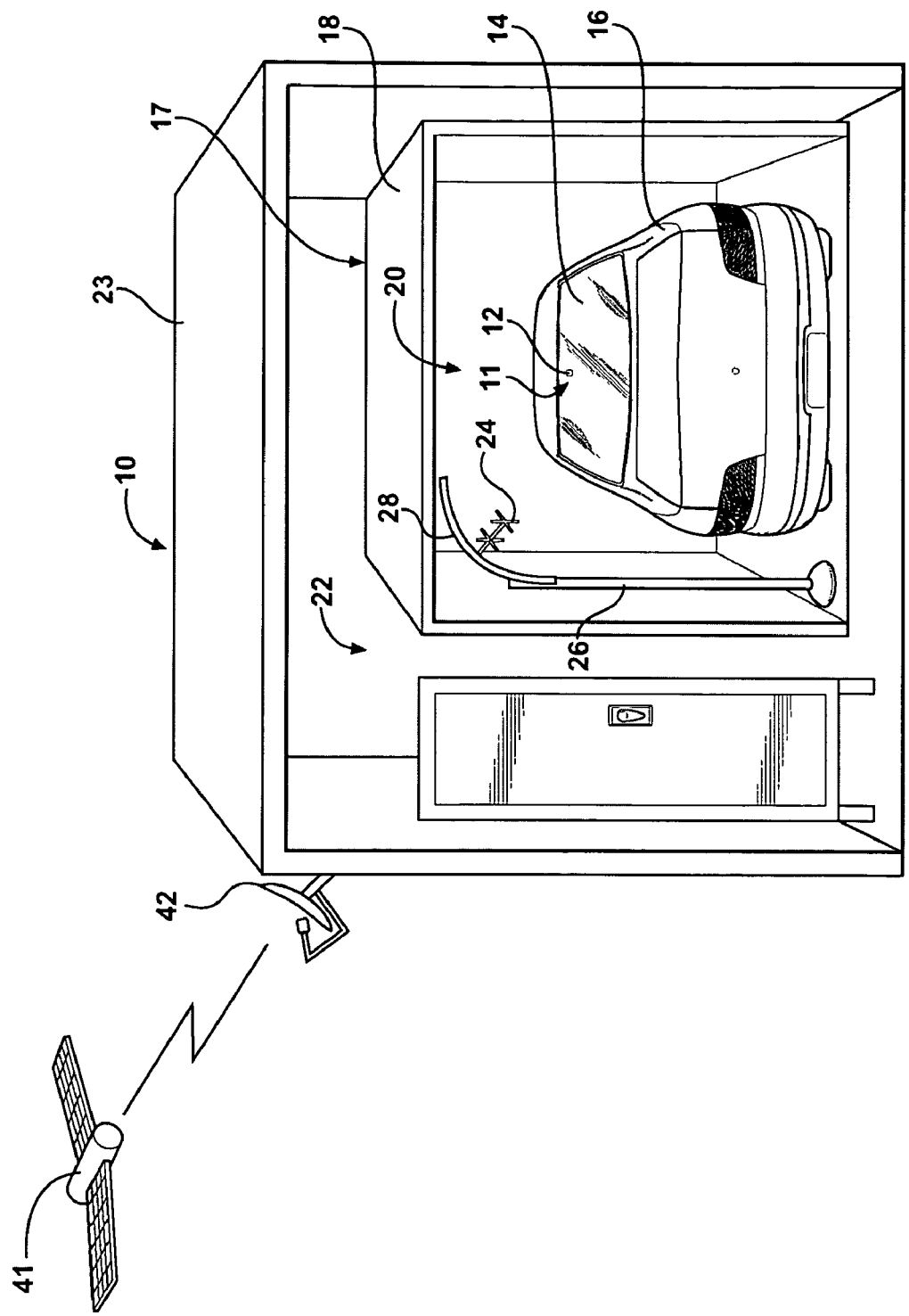
FIG. 1 is a perspective view of one embodiment of a system for testing an antenna showing a subject antenna integrated with a vehicle and disposed in an RF testing facility.

Referring to the Figures, wherein like numerals indicate corresponding parts throughout the several views, a signal measurement system is shown at 10.

The signal measurement system 10 is utilized to test at least one radio frequency (RF) component 11 for determining its performance characteristics. The RF component 11 may be any electrical or electronic device in need of testing by exposure to an RF signal. In the illustrated embodiments, the RF component 11 is shown as a subject antenna 12, a receiver 34, and/or an amplifier 34. However, those skilled in the art realize other devices that may be suitable for testing.

The system 10 may be utilized to test one RF component 11 at a time or multiple RF components 11 at the same time. The RF component 11 may be tested in a stand-alone configuration, i.e., the RF component 11 is isolated from other objects that may affect its performance. Alternatively, the RF component 11 may be tested while integrated with other components. For example, referring to FIG. 1, the subject antenna 12 may be integrated with a window 14 of a vehicle 16, to provide a more realistic test of the performance of the subject antenna 12. The subject antenna 12 may be commonly referred to by those skilled in the art as "an antenna under test".

The subject antenna 12 is disposed in an RF testing facility 17. The RF testing facility 17 is an enclosed area free from the elements, i.e., rain, snow, etc., in which testing of the RF component occurs. As such, and as described in detail below, the signal measurement system 10 may be used to replace, or complement, traditional field-testing of the RF component 11. The RF testing facility 17 defines an interior 20 and an exterior 22.

Referring to FIG. 1, the RF testing facility 17 may be implemented as an RF anechoic chamber 18 (hereafter referred to simply as the "chamber" 18). Such chambers 18 are well known to those skilled in the art. The chamber 18 suppresses RF signals and noise existing outside of the chamber 18 to provide an environment inside the chamber 18 that is relatively free of spurious RF signals and noise. The chamber 18 may be covered with a radiation absorbent material (not shown), typically on the interior-side walls of the chamber 18. This material minimizes and mitigates the reflections of test signals transmitted in the interior 20 of the chamber 18. Furthermore, the chamber 17 may be surrounded by highly conductive material to provide shielding between the interior 20 and exterior 22 of the chamber 18. Those skilled in the art appreciate other shielding techniques to implement the chamber 18. Preferably, the chamber 18 is disposed inside a larger structure 23, such as, but not limited to, a test laboratory. Moreover, those skilled in the art realize other suitable implementations of the RF testing facility 17 besides the chamber 18.

The system 10 includes a transmitting antenna 24 disposed inside the RF testing facility 17, i.e., in the interior 20 of the RF testing facility 17. The transmitting antenna 24 transmits an RF testing signal such that the RF testing signal may be received by the RF component 11. In the illustrated embodiments, the transmitting antenna 24 produces a waveform that mimics the waveform produced by satellites, preferably a circularly polarized waveform. However, those skilled in the art appreciate that the transmitting antenna 24 may be implemented by any number of techniques to produce other waveforms as are suitable for testing different RF components 11. Furthermore, the transmitting antenna 24 may also be implemented as a plurality of transmitting antennas 24 (plurality not shown).

The system 10 preferably includes an adjustable positioning mechanism 26 for supporting the transmitting antenna 24. The adjustable positioning mechanism 26 allows the transmitting antenna 24 to be adjusted for distance and/or angle with respect to the RF component 11. This permits positioning of the transmitting antenna 24 to simulate a broadcast antenna at a variety of antenna-to-antenna configurations. Those skilled in the art realize numerous techniques to implement the adjustable positioning mechanism 26 for allowing manual and/or automatic movement of the transmitting antenna 24. Also, in the illustrated embodiments, as shown in FIG. 1, the adjustable positioning mechanism 26 includes a support arm 28 having an arch-like shape. The arch-like shape of the mechanism 26 provides convenient variability of the angle of the transmitting antenna 24 with respect to the subject antenna 12. The arch-like shape of the support arm 28 allows testing at any possible elevation angle that the the broadcast antenna, such as antenna of a satellite, may have with respect to the RF component 11.

Figure 2:
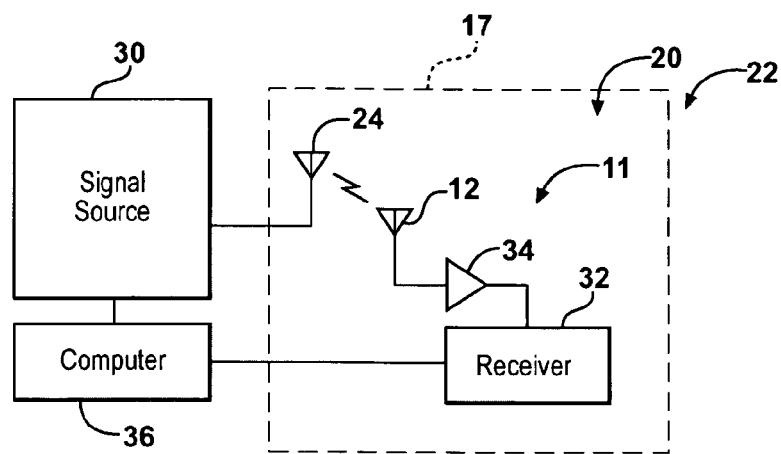
FIG. 2 is a schematic block diagram of the system showing a signal source for generating an RF testing signal that is transmitted within the chamber.

The system 10 also includes a signal source 30 for generating the RF testing signal. The signal source 30 is in communication with the transmitting antenna 24, as is shown schematically in FIG. 2, to provide the RF testing signal to the transmitting antenna 24. Several techniques may be employed for generating the RF testing signal, as is described in detail below.

As stated above, the RF component 11 being tested may include the receiver 32. In the illustrated embodiments, the receiver 32 is in communication with the subject antenna 12, i.e., the receiver 32 is electrically connected to the subject antenna 12. However, the testing may be limited to one or both of the subject antenna 12 and/or the receiver 32. The receiver 32 demodulates the RF testing signal received by the subject antenna 12. In embodiments where the RF testing signal carries digital data, the receiver 32 may also decode this data.

Also as stated above, the RF component 11 being tested may include the amplifier 34. The amplifier 34 may be utilized to boost the RF testing signal between the subject antenna 12 and the receiver 32. As such, the amplifier 34 is electrically connected between the subject antenna 12 and the receiver 32. Preferably, the amplifier 34 is a low-noise amplifier (LNA) as is well known to those skilled in the art. However, those skilled in the art realize alternative implementations for the amplifier 34. Furthermore, the amplifier 34 may be integrated within packaging of the subject antenna 12.

In the illustrated embodiments, a computer 36 is in communication with the receiver 32. The computer 36 receives various information from the receiver 34 and analyzes performance of the RF component 11. This information may include, but is not limited to, signal strength, signal-to-noise ratio, mute time, data rate, numbers/rate of data errors, and data error correction count. The computer 36 may also store records about the particular test being performed on the RF component 11. These records may include, but are not limited to, angle(s) between the transmitting and subject antennas 24, 12, a distance(s) between the transmitting and subject antennas 24, 12, power transmitted by the transmitting antenna 24, and the frequency or frequencies under test.

However, in other embodiments, the performance of the RF component 11 is performed without the aid of the computer 36. For example, performance of the RF component 11 may be evaluated by a technician listening to a speaker (not shown) that is in communication with the RF component 11. As another example, performance of the RF component 11 may be evaluated by a the technician evaluating an oscilloscope (not shown) connected to the RF component 11. Those skilled in the art realize other techniques for analyzing the performance of the RF component 11.

Figure 3:
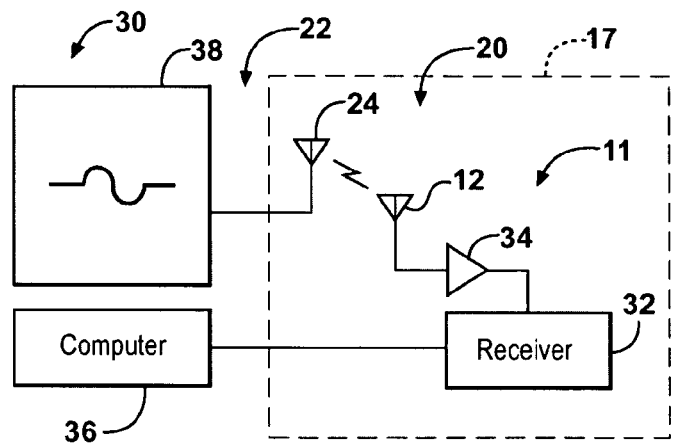
FIG. 3 is a schematic block diagram of a first embodiment of the system showing a signal generator used as the signal source.

In a first embodiment, as shown in FIG. 3, the signal source 30 is implemented as a signal generator 38. As such, the signal generator 38 is in communication with the transmitting antenna 24. The signal generator 38 produces a waveform that is used as the RF testing signal. The waveform may be a simple, repetitive sinusoid. Alternatively, the waveform may be modulated by frequency, amplitude, or phase. In addition, the waveform may encode digital data. Those skilled in the art realize numerous other different and modified waveforms that may be generated by the signal generator 38 to be used as the RF testing signal.

Figure 4:
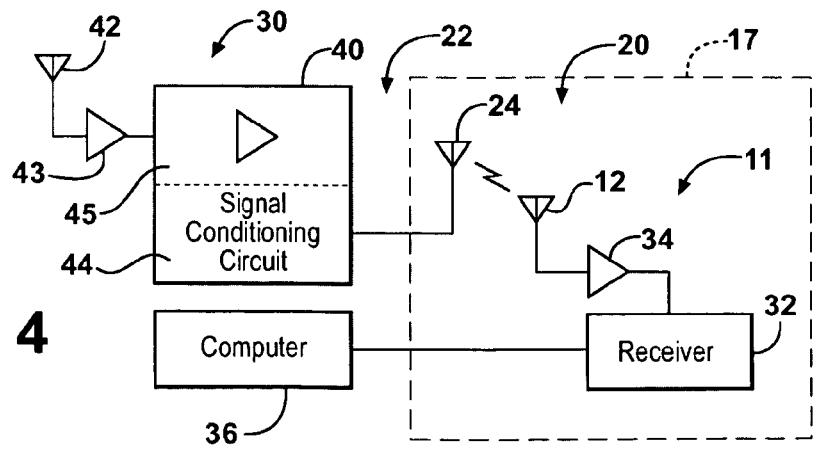
FIG. 4 is a schematic block diagram of a second embodiment of the system showing a repeater as the signal source.

In a second embodiment, as shown in FIG. 4, the signal source 30 is implemented as a repeater 40 for receiving and retransmitting a signal. As such, the repeater 40 is in communication with the transmitting antenna 24. The repeater is also in communication with an exterior antenna 42. The exterior antenna 42 is disposed outside of the RF testing facility 17 for receiving an RF broadcast signal. That is, the exterior antenna 42 is disposed in the exterior 22 of the RF testing facility 17. When the RF testing facility 17 is implemented as the chamber 18, the RF broadcast signal may be received unencumbered by the RF suppression of the chamber 18.

In the second embodiment, the RF exterior antenna 42 receives the RF broadcast signal from a satellite 41, such as one of the satellites used by a Satellite Digital Audio Radio Service (SDARS) provider. As such, the RF broadcast signal has a circularly polarized waveform. However, the RF broadcast signal may be broadcast from terrestrial sources and/or have a waveform of a different polarization. Also, the RF exterior antenna 42 in the second embodiment is shown outside the structure 23 to provide unobstructed reception of the RF broadcast signal. Those skilled in the art realize that the RF exterior antenna 42 may be disposed in any number of locations with or without obstructions. Furthermore, the exterior antenna 42 may include an amplifier 43, such as an LNA, to amplify the RF broadcast signal.

The repeater 40 receives the RF broadcast signal from the exterior antenna 42 and generates the RF testing signal. Said another way, the repeater 40 repeats the RF broadcast signal as the RF testing signal. Accordingly, the RF testing signal generally corresponds to the RF broadcast signal. However, the RF testing signal may not be precisely the same as the RF broadcast signal.

The repeater 40 preferably includes a signal conditioning circuit 44. The signal conditioning circuit 44 modifies the RF broadcast signal received by the exterior antenna 42 to produce the RF testing signal. The signal conditioning circuit 44 controls the modification of the RF broadcast signal based on predetermined, desired characteristics of the RF testing signal to be received by the RF component 11. The predetermined, desired characteristics relate to the particular test that is being performed on the RF component 11. For example, the signal conditioning circuit 44 may increase or decrease a gain of the RF testing signal, vary the gain of the RF testing signal, or introduce interference into or otherwise distort the RF testing signal. As such, the signal conditioning circuit 44 helps to mimic many of the real-world conditions that occur in a field-test of the subject antenna 12.

The signal conditioning circuit 44 is preferably in communication with the computer 36. As such, the computer 36 may be utilized to control the modification of the RF testing signal. These modifications may be based solely on the predetermined, desired characteristics of the RF testing signal. The level of the RF testing signal may be adjusted to mimic the level of the RF broadcast signal received from the satellite 41 at a specific geographical location of interest. The signal conditioning circuit may also be used to adjust the level of the RF broadcast signal received from the satellite 41 under severe propagation conditions, e.g., dense vegetation, tall building obstructions, or solar disturbances.

However, the modifications may also be based on a combination of the predetermined desired characteristics and the RF testing signal actually received by the RF component 11. That is, the RF testing signal that is broadcast by the transmitting antenna 24 may be modified in response to the RF testing signal that is received by the RF component 11. For example, the level of the RF testing signal transmitted by the transmitting antenna 24 may be adjusted via feedback loop for calibration adjustment based on the RF testing signal that is received by the RF component 11. Alternatively, the signal conditioning circuit 44 may operate independently from the computer 36; that is, the signal conditioning circuit 44 and computer 36 are not in communications with one another.

Use of the repeater 40 allows for the use an actual RF broadcast signal in the RF test facility 17 to test the RF component 11. This is especially crucial in the controlled environment of the RF anechoic chamber 18. The RF broadcast signal has been affected by propagation conditions such that a "real-world" test of the RF component 11 can be performed inside the chamber 18. This reduces and/or eliminates the need for costly field testing of RF component 11. Accordingly, the financial and environmental costs for testing the RF component 11, especially when mounted to the vehicle 16, are greatly reduced, since there is no need for long distance driving of the vehicle 16. Moreover, use of the system 10 reduces the development cycle of the RF component 11, as the RF component 11 may be subjected to testing almost immediately, without the burden of logistical scheduling, time of day, geographic location, or weather conditions of a particular season (e.g., snow in winter or vegetation in summer).

The repeater 40 may also include an amplification circuit 45. The amplification circuit 45 amplifies the RF broadcast signal and/or the RF testing signal (collectively referred to as "the signal"). The amplification circuit 45 allows greater distances between the exterior antenna 42 and the transmitting antenna 24.

Figure 5:
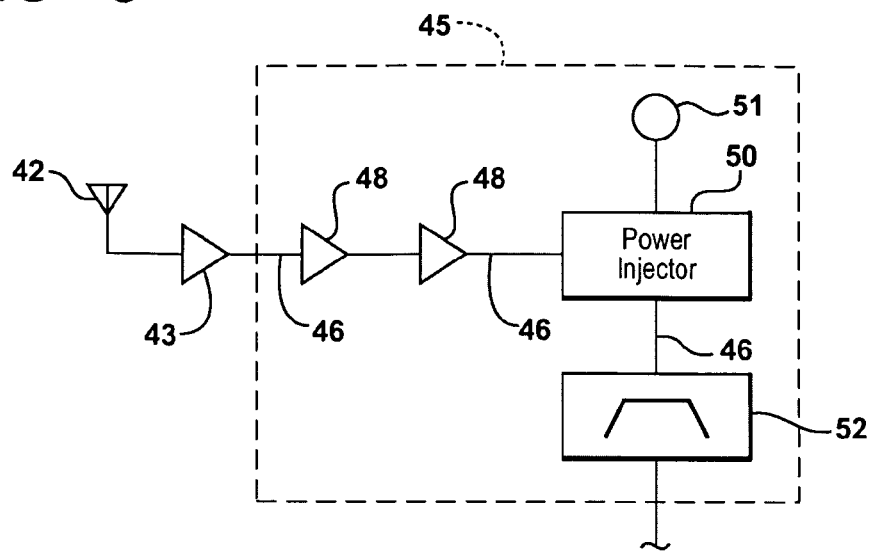
FIG. 5 is a schematic block diagram of an amplification circuit of the repeater.

Referring now to FIG. 5, the amplification circuit 45 includes a signal line 46 for propagating the signal. At least one amplifier 48 is electrically connected to the signal line 46. The number of amplifiers 48 needed is determined by the signal loss characteristics of the signal line 46, the length of the signal line 46, and the electrical characteristics of each amplifier 48. In one implementation of the amplification circuit 45, about 100 feet of signal line 46 separates each of the amplifiers 48.

The amplification circuit 45 also preferably includes a power injector 50 electrically connected to the signal line 46. The power injector 50 provides a path to power to each amplifier 48 without disrupting the signal being amplified by the amplification circuit 44. The power injector 50 is electrically connected to a power source 51.

The amplification circuit 45 may include a band-pass filter 52 electrically connected to the signal line 46. The band-pass filter 52 filters out frequencies above and below the desired frequency band, as is well known to those skilled in the art.

Figure 6:
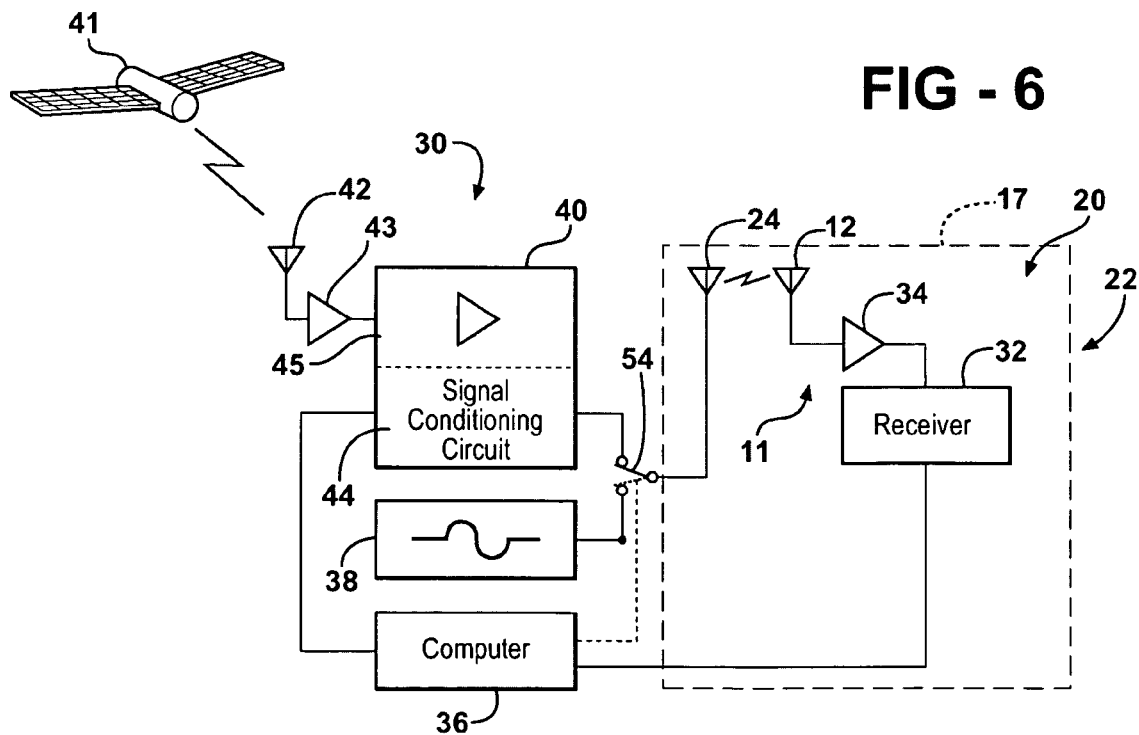
FIG. 6 is a schematic block diagram of a third embodiment of the system showing both the repeater and the signal generator, with either one as the signal source.

In a third embodiment, as shown in FIG. 6, the signal source 30 is implemented using both the signal generator 38 and the repeater 40. A switch 54 is electrically connected between the transmitting antenna 24, the signal generator 38, and the repeater 40. This arrangement allows communication of the RF testing signal either between the repeater 40 and the transmitting antenna 24 or between the signal generator 38 and the transmitting antenna 24. The switch 54 is preferably coupled to the computer 36. This allows the computer 36, running an analysis program, to automatically switch between using the signal generator 38 and the repeater 40 as the signal source 30.

The subject invention also presents a method of testing the subject antenna 12 disposed in the RF anechoic chamber 18. The steps of this method have been described above with relationship to the system 10 and are recited hereafter for purposes of convenience. However, although the steps of the method are described with relationship to the exemplary system 10, those skilled in the art will realize that these steps may be practiced with other systems and configurations.

The method includes the step of receiving an RF broadcast signal with the exterior antenna 42 disposed outside the chamber 18. That is, the exterior antenna 42 is located such that the RF broadcast signal may be received without suppression by the chamber 18.

The method also includes the step of generating the RF testing signal generally corresponding to the RF broadcast signal. This RF testing signal may present a waveform that is a nearly exact duplicate of a waveform of the RF broadcast signal, i.e., an unmodified waveform. Alternatively, the RF testing signal may present a waveform that is different in some way from that of the RF broadcast signal, i.e., a modified waveform. As such, the step of generating the RF testing signal may include the step of modifying the RF broadcast signal to generate the RF testing signal. This modification of the RF broadcast signal may be based on predetermined desired characteristics of the RF testing signal.

The method may also include the step of amplifying at least one of the RF broadcast signal and the RF testing signal. In the illustrated embodiments, the RF broadcast signal is amplified. Said another way, the RF broadcast signal is amplified before the RF testing signal is generated. In other embodiments, the amplification may occur at other stages of signal transmission, such as after the RF testing signal is generated.

The method further includes the steps of transmitting the RF testing signal with a transmitting antenna 24 disposed inside the chamber 18 and receiving the RF testing signal with the subject antenna 12. In response to the reception of the RF testing signal, the method continues by analyzing the RF testing signal received by the subject antenna 12.

The received and analyzed RF testing signal may be utilized in the modification of the RF testing signal. Specifically, the modification of the RF broadcast signal may be based on predetermined desired characteristics of the RF testing signal to be received by the subject antenna 12 and in response to the RF testing signal actually received by the subject antenna 12.

The present invention has been described herein in an illustrative manner, and it is to be understood that the terminology which has been used is intended to be in the nature of words of description rather than of limitation. Obviously, many modifications and variations of the invention are possible in light of the above teachings. The invention may be practiced otherwise than as specifically described within the scope of the appended claims.

What is claimed is:

1. A signal measurement system for testing at least one RF component, said system comprising:
    an enclosed RF testing facility;
    an exterior antenna disposed outside the facility for receiving an RF broadcast signal;
    a repeater in communication with said exterior antenna for receiving the RF broadcast signal from the exterior antenna and generating an RF testing signal; and
    a transmitting antenna disposed inside the facility and in communication with said repeater for transmitting the RF testing signal such that the RF testing signal may be received by the RF component.

2. A system as set forth in claim 1 wherein said repeater includes a signal conditioning circuit for modifying the RF broadcast signal received by the exterior antenna and generating the RF testing signal.

3. A system as set forth in claim 2 wherein said signal conditioning circuit controls the modification of the RF broadcast signal based on predetermined desired characteristics of the RF testing signal to be received by the RF component.

4. A system as set forth in claim 3 further comprising a computer in communication with the RF component for analyzing the RF testing signal received by the RF component.

5. A system as set forth in claim 4 wherein said signal conditioning circuit is in communication with said computer such that said computer controls the modification of the RF testing signal based on the predetermined desired characteristics of the RF testing signal and in response to the RF testing signal actually received by the RF component.

6. A system as set forth in claim 1 wherein said RF testing facility is further defined as an RF anechoic chamber for suppressing undesired RF signals and noise existing in an exterior of said chamber.

7. A system as set forth in claim 1 wherein said at least one RF component includes a subject antenna.

8. A system as set forth in claim 1 wherein said at least one RF component includes a receiver electrically connected to an antenna for receiving the RF testing signal.

9. A system as set forth in claim 1 wherein said repeater includes an amplification circuit for amplifying at least one of the RF broadcast signal and the RF testing signal.

10. A system as set forth in claim 9 wherein said amplification circuit includes a signal line for propagating the at least one signal therethrough.

11. A system as set forth in claim 10 wherein said amplification circuit includes at least one amplifier electrically connected to said signal line.

12. A system as set forth in claim 11 wherein said amplification circuit includes a power injector electrically connected to said signal line and a power supply for providing power to said at least one amplifier without disrupting the at least one signal.

13. A system as set forth in claim 1 further comprising a signal generator in communication with said transmitting antenna for generating the RF testing signal.

14. A system as set forth in claim 13 further comprising a switch electrically connected to said repeater, said signal generator, and said transmitting antenna for allowing communication of said RF testing signal either between said repeater and said transmitting antenna or between said signal generator and said transmitting antenna.

15. A system as set forth in claim 1 further comprising an adjustable positioning mechanism supporting said transmitting antenna such that said transmitting antenna may be adjusted for distance and/or angle with respect to said RF component.

16. A system as set forth in claim 15 wherein said adjustable positioning mechanism includes a support arm having an arch-like shape.

17. A method of testing at least one RF component disposed in an enclosed RF testing facility, said method comprising the steps of:
    receiving an RF broadcast signal with an exterior antenna disposed outside the facility;
    generating an RF testing signal generally corresponding to the RF broadcast signal;
    transmitting the RF testing signal with a transmitting antenna disposed inside the facility;
    receiving the RF testing signal with the RF component; and
    analyzing the RF testing signal received by the RF component.

18. A method as set forth in claim 17 wherein said step of generating the RF testing signal is further defined as modifying the RF broadcast signal to generate the RF testing signal.

19. A method as set forth in claim 18 wherein said step of modifying the RF broadcast signal is further defined as modifying the RF broadcast signal based on predetermined desired characteristics of the RF testing signal to be received by the subject antenna.

20. A method as set forth in claim 18 wherein said step of modifying the RF broadcast signal is further defined as modifying the RF broadcast signal based on predetermined desired characteristics of the RF testing signal to be received by the RF component and in response to the RF testing signal actually received by the RF component.

21. A method as set forth in claim 17 further comprising the step of amplifying at least one of the RF broadcast signal and the RF testing signal.

22. A signal measurement system for testing at least one RF component disposed inside an RF anechoic chamber, said system comprising:
 a signal source for providing an RF testing signal;
 a transmitting antenna disposed inside the chamber and in communication with said source for transmitting the RF testing signal such that the RF testing signal may be received by the RF component; and
 a computer in communication with said RF component and said signal source for analyzing the RF testing signal received by the RF component and modifying the RF testing signal transmitted by the transmitting antenna based on the RF testing signal received by the RF component.

23. A system as set forth in claim 22 wherein said signal source is further defined as an exterior antenna disposed outside the chamber for receiving an RF broadcast signal and a repeater in communication with said exterior antenna for receiving the RF broadcast signal from said exterior antenna and generating an RF testing signal.

24. A system as set forth in claim 22 wherein said signal source is further defined as a signal generator for generating the RF testing signal.

25. A system as set forth ion claim 22 wherein said at least one RF component includes a subject antenna.

26. A system as set forth in claim 22 wherein said at least one RF component includes a receiver electrically connected to an antenna for receiving the RF testing signal.

* * * * *

UNITED STATES PATENT AND TRADEMARK OFFICE
CERTIFICATE OF CORRECTION

| | |
|---|---|
| PATENT NO. | : 7,880,670 B2 |
| APPLICATION NO. | : 12/139616 |
| DATED | : February 1, 2011 |
| INVENTOR(S) | : Villarroel et al. |

It is certified that error appears in the above-identified patent and that said Letters Patent is hereby corrected as shown below:

ON THE TITLE PAGE OF PATENT:

Front Page, Item (73) Assignee, please delete "AGC Automotive, Ypsilanti, MI (US)" and replace with -- AGC Automotive Americas R&D, Inc., Ypsilanti, MI (US) --

IN THE CLAIMS:

Column 10, line 14, after "as set forth" please delete "ion" and replace with -- in --

Signed and Sealed this
Seventh Day of June, 2011

David J. Kappos
*Director of the United States Patent and Trademark Office*